United States Patent
Roufoogaran

(10) Patent No.: US 7,110,742 B2
(45) Date of Patent: Sep. 19, 2006

(54) LOW NOISE AMPLIFIER WITH CONSTANT INPUT IMPEDANCE

(75) Inventor: Razieh Roufoogaran, Marina Del Ray, CA (US)

(73) Assignee: Broadcom Corporation, Irvine, CA (US)

( * ) Notice: Subject to any disclaimer, the term of this patent is extended or adjusted under 35 U.S.C. 154(b) by 368 days.

(21) Appl. No.: 10/802,016

(22) Filed: Mar. 16, 2004

(65) Prior Publication Data
US 2005/0208921 A1    Sep. 22, 2005

(51) Int. Cl.
H04B 1/28    (2006.01)
H03F 1/30    (2006.01)

(52) U.S. Cl. .................... 455/333; 455/232.1; 330/144

(58) Field of Classification Search ............... 455/73, 455/78, 82, 83, 232.1, 311, 333, 550.1; 330/76, 330/144, 152, 185, 189, 250, 257, 282, 288
See application file for complete search history.

(56) References Cited

U.S. PATENT DOCUMENTS

| | | | | |
|---|---|---|---|---|
| 5,206,607 A | * | 4/1993 | Shiga | ..................... 330/286 |
| 6,061,551 A | * | 5/2000 | Sorrells et al. | ............. 455/118 |
| 6,288,609 B1 | * | 9/2001 | Brueske et al. | .......... 455/234.1 |
| 6,366,166 B1 | * | 4/2002 | Belot | ......................... 330/252 |
| 6,933,779 B1 | * | 8/2005 | Lee et al. | .................... 330/283 |
| 6,977,552 B1 | * | 12/2005 | Macedo | ...................... 330/283 |

* cited by examiner

Primary Examiner—Quochien B. Vuong
(74) Attorney, Agent, or Firm—Garlick Harrison & Markison; Timothy W. Markison

(57) ABSTRACT

A low noise amplifier includes an input transistor, an inductor, and a current sink. The input transistor includes a gate, a drain, and a source, wherein the gate of the input transistor is operably coupled to receive an input radio frequency (RF) signal. The inductor includes a first node and a second node, wherein the first node of the inductor is operably coupled to a power supply and the second node of the inductor is operably coupled to the drain of the input transistor to provide an output of the low noise amplifier. The current sink includes a first node and a second node, wherein the first node of the current sink is operably coupled to the source of the input transistor and the second node of the current sink is operably coupled to a circuit ground, wherein a real component of input impedance of the low noise amplifier is substantially constant when the low noise amplifier is in the off mode as when the low noise amplifier is in the on mode.

14 Claims, 7 Drawing Sheets

LNA 72

*prior art LNA*

LNA input impedance = gmL3,4 / C$_P$1,2

LNA 72

LNA 72

LNA 72

LNA 72

LNA 72

LOW NOISE AMPLIFIER WITH CONSTANT INPUT IMPEDANCE

BACKGROUND OF THE INVENTION

1. Technical Field of the Invention

This invention relates generally to wireless communication devices and more particularly to radio interfaces of such wireless communication devices.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

In many wireless applications, a radio transceiver includes one antenna that is shared by the receiver section and the transmitter section. The sharing of the antenna may be achieved by a transmit/receive switch or a transformer balun. In recent advances in the wireless communication art, a transformer balun has been implemented on-chip with the receiver section and the transmitter section. In such an implementation, a single-ended winding of the transformer balun is operably coupled to the antenna, a first differential winding of the transformer balun is operably coupled to the receiver section, and another differential winding of the transformer balun is operably coupled to the transmitter section.

While the benefits of using an on-chip balun are many, there are some issues of concern, which include impedance matching of the loads on the single-ended winding and on the differential winding, efficient energy transfer from the transmitter section to the antenna via the transformer balun, and complexity of implementation. Such issues arise, at least in part, due to the loading of the transformer balun varies depending on whether the transceiver is in a transmit mode or in a receive mode. For example, the output impedance of the power amplifier, which is a load on the differential winding, varies depending on whether the power amplifier is active or inactive. Further, the input impedance of the low noise amplifier, which is a load on the differential winding, varies by a factor of two or more depending on whether the low noise amplifier is active or inactive.

FIG. 1 is a schematic block diagram of a known low noise amplifier (LNA), which exhibits a variable input impedance. As shown, the LNA includes a differential architecture wherein a differential RF signal is received at the LNA inputs N and P and produces a differential output at LNA OUT N and P. When the LNA is active, the input impedance of the LNA is based on the transconductance (gm) of the input transistors, the parasitic capacitance of the input transistors, and the series inductance between the source of the input transistors and ground, which may be a separate inductor or parasitic inductance of the coupling. When the LNA is inactive, its input inductance is based on the parasitic capacitance and the series inductance. As such, the input impedance of the LNA varies significantly depending on whether the LNA is active or inactive.

Therefore, a need exists for a low noise amplifier that has a substantially constant input impedance regardless of whether it is active or inactive such a radio front end may provide efficient energy transfer from the transmitter section to the antenna, provide enhanced impedance matching, and reduce the complexity of implementation.

BRIEF SUMMARY OF THE INVENTION

The low noise amplifier having a substantially constant input impedance of the present invention substantially meets these needs and others. In one embodiment, a low noise amplifier includes an input transistor, an inductor, and a current sink. The input transistor includes a gate, a drain, and a source, wherein the gate of the input transistor is operably coupled to receive an input radio frequency (RF) signal. The inductor includes a first node and a second node, wherein the first node of the inductor is operably coupled to a power supply and the second node of the inductor is operably coupled to the drain of the input transistor to provide an output of the low noise amplifier. The current sink includes a first node and a second node, wherein the first node of the current sink is operably coupled to the source of the input transistor and the second node of the current sink is operably coupled to a circuit ground, wherein a real component of input impedance of the low noise amplifier is substantially constant when the low noise amplifier is in the off mode as when the low noise amplifier is in the on mode.

DETAILED DESCRIPTION OF THE INVENTION

Figure 1:
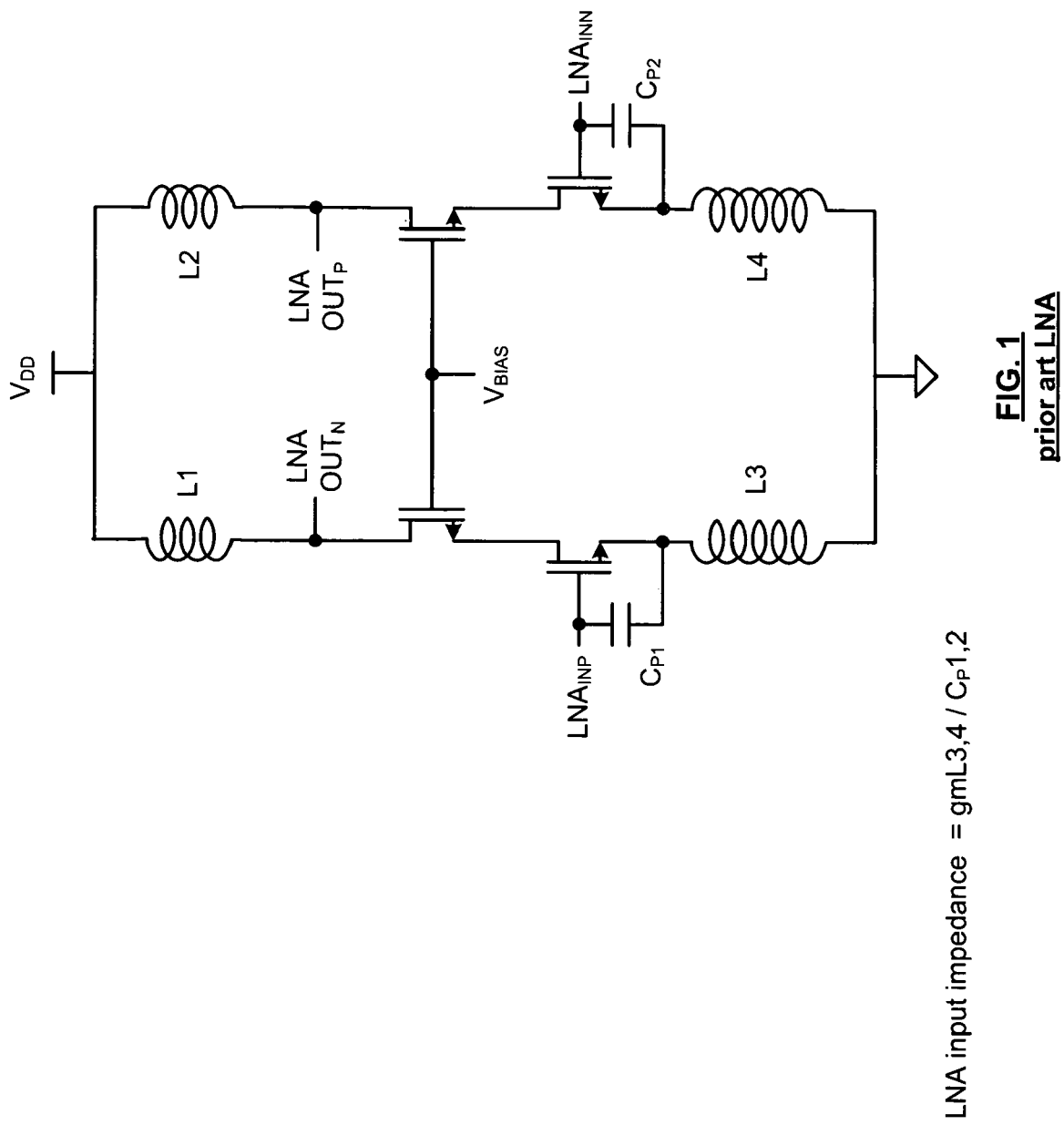
FIG. 1 is a schematic block diagram of a prior art low noise amplifier (LNA)
Figure 2:
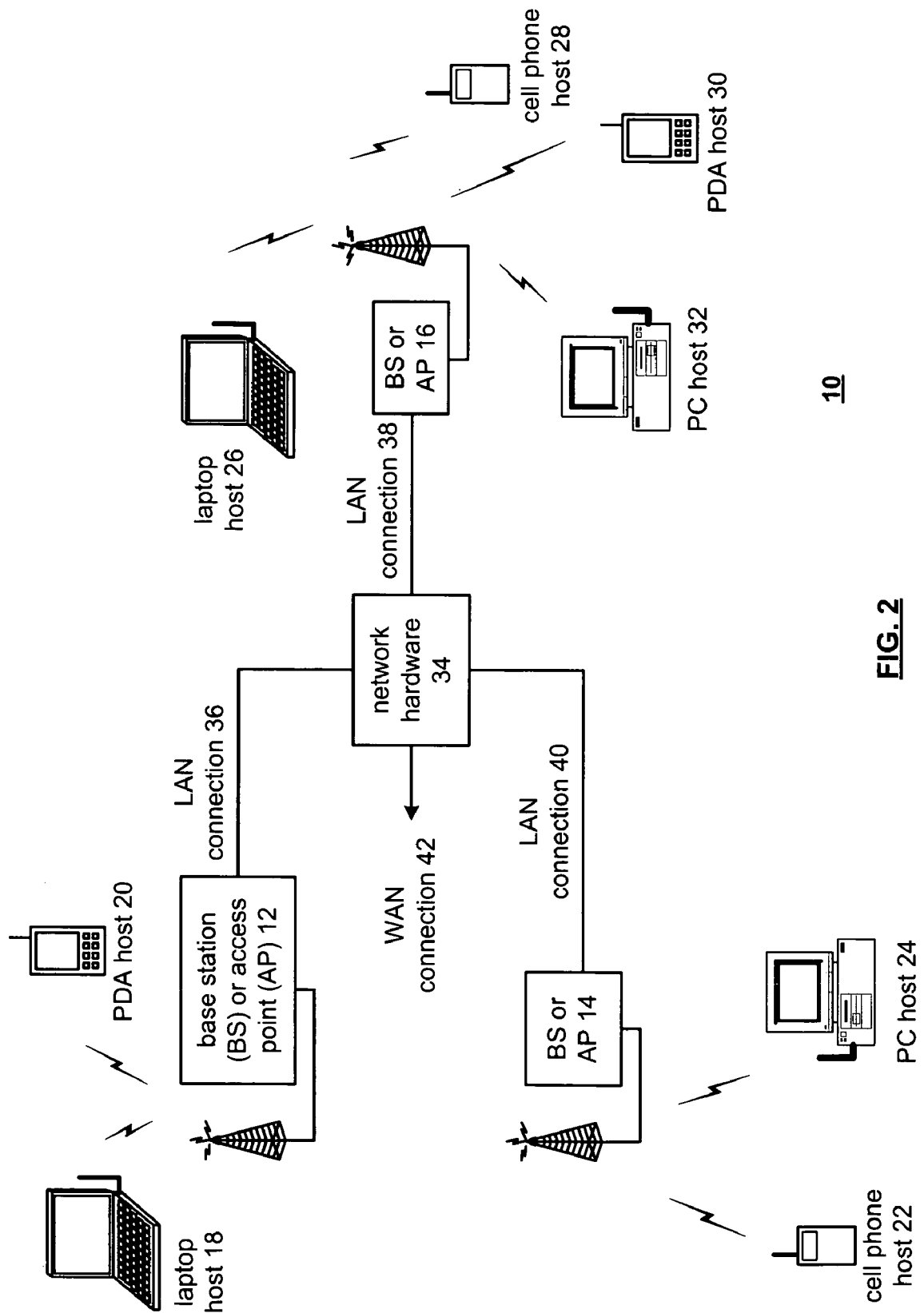
FIG. 2 is a schematic block diagram of a wireless communication system in accordance with the present invention.

FIG. 2 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 3.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 3:
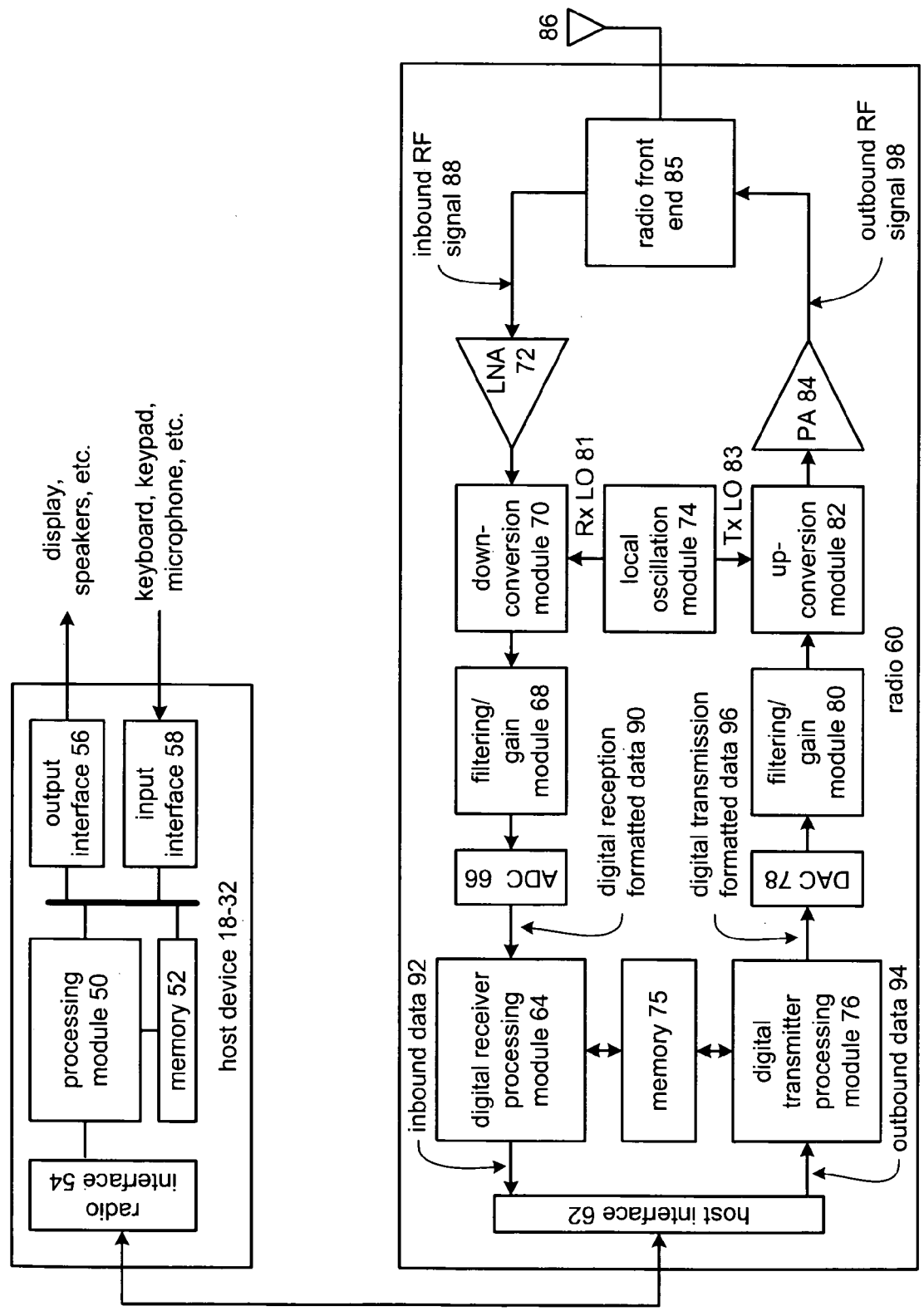
FIG. 3 is a schematic block diagram of a wireless communication device in accordance with the present invention.

FIG. 3 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a low noise amplifier 72, a radio front end 85, a local oscillation module 74, memory 75, a digital transmitter processing module 76, a digital-to-analog converter 78, a filtering/gain module 80, an IF mixing up conversion stage 82, a power amplifier 84, and an antenna 86. The antenna 86 is shared by the transmit and receive paths via the radio front end 85.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is provide to the antenna 86 via the radio front end 85, where the antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the low noise amplifier 72 via the radio front end 85. The low noise amplifier 72, which has a substantially constant input impedance and will be discussed in greater detail with reference to FIGS. 4–8, amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 4:
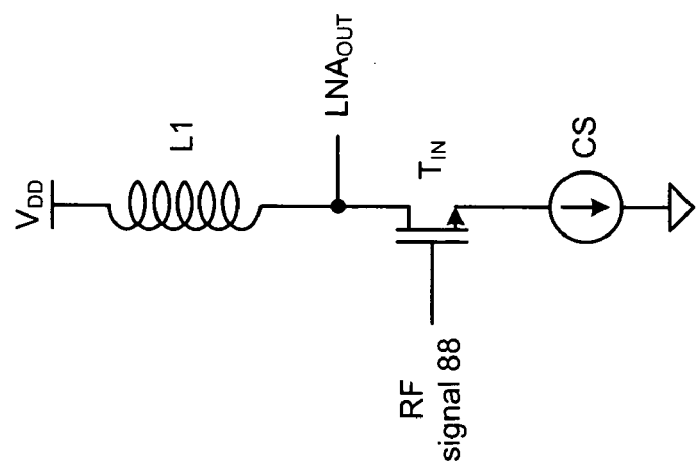
FIG. 4 is a schematic block diagram of an embodiment of a low noise amplifier in accordance with the present invention.

FIG. 4 is a schematic block diagram of a low noise amplifier (LNA) 72 that includes an input transistor $T_{IN}$, and inductor $L_1$ and a current source (CS). The input transistor is operably coupled to receive an RF signal 88 and amplify it based on the inductor, the properties of the transistor $T_{IN}$, and the current being sinked by the current source. The output of the low noise amplifier is provided at the node coupling the drain of the input transistor $T_{IN}$ to the inductor. Such a low noise amplifier is configured for single-ended signals and provides a substantially constant input impedance whether the wireless communication device is in a transmit or receive mode, where the LNA is off in the transmit mode and is enabled in the receive mode. The values of the inductor and current sinked by the current source will vary depending on the desired output power and frequency of the RF signal. For example, the inductor $L_1$ may range from hundredths of nano-henries to tens of nano-henries and the input transistor may range in a width length ratio of 50 microns/0.065 microns to 150 microns/0.26 microns.

Figure 5:
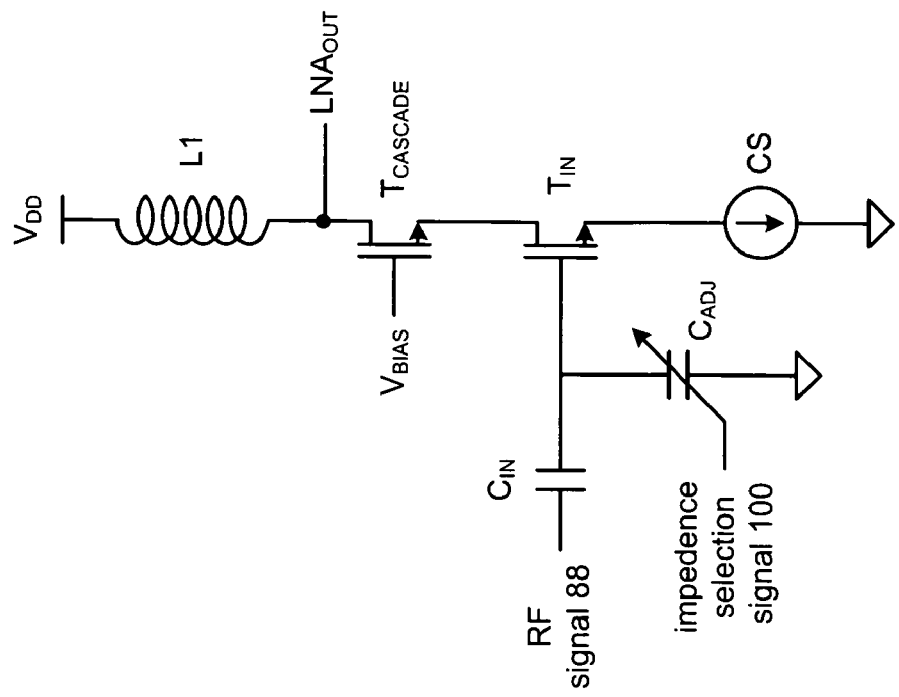
FIG. 5 is a schematic block diagram of another embodiment of a low noise amplifier in accordance with the present invention.

FIG. 5 is a schematic block diagram of another embodiment of a low noise amplifier 72. In this embodiment, the low noise amplifier 72 includes inductor $L_1$, a cascode transistor $T_{CASCODE}$, the input transistor, the current source (CS), an adjustable capacitor $C_{ADJ}$ and an input capacitor $C_{IN}$. The cascode transistor is bias via a bias voltage $V_{BIAS}$, where the low noise amplifier output ($LNA_{OUT}$) is provided at the node coupling the inductor to the cascode transistor.

The RF signal 88 is operably coupled to the input transistor via the input capacitor $C_{IN}$. To adjust the input impedance, the adjustable capacitor $C_{ADJ}$ is adjusted based on an input selection signal 100. In this embodiment, the input capacitor in series with the parallel combination of the parasitic capacitance of the input transistor and the adjustable capacitor provide the input impedance of the low noise amplifier when the LNA 72 is enabled. Note that, in the on state, the current source appears as a short circuit for high frequency signal analysis. In the off state of the LNA, the input capacitor in series with the parallel combination of the parasitic capacitance of the current source, the parasitic capacitance of the input transistor, and the input capacitor provide the input impedance of the low noise amplifier.

In this embodiment, the adjustable capacitor provides a $1^{st}$ capacitance value based on the impedance selection signal when the low noise amplifier is in the off-mode and provides a $2^{nd}$ capacitance value based on the impedance selection signal 100 when the low noise amplifier is in the on-mode such that an imaginary component of the low noise amplifier input impedance is substantially constant regardless of whether the low noise amplifier is in the on-mode or off-mode.

As one of average skill in the art will appreciate, the input impedance of low noise amplifier 72 includes a real component and an imaginary component. With the various configurations of FIGS. 4–8, the real component of the input impedance of the low noise amplifier remains substantially constant regardless of whether the low noise amplifier is in the on-mode or off-mode. To ensure that the imaginary component of the input impedance of the low noise amplifier remains substantially constant, the adjustable capacitor is adjusted.

Figure 6:
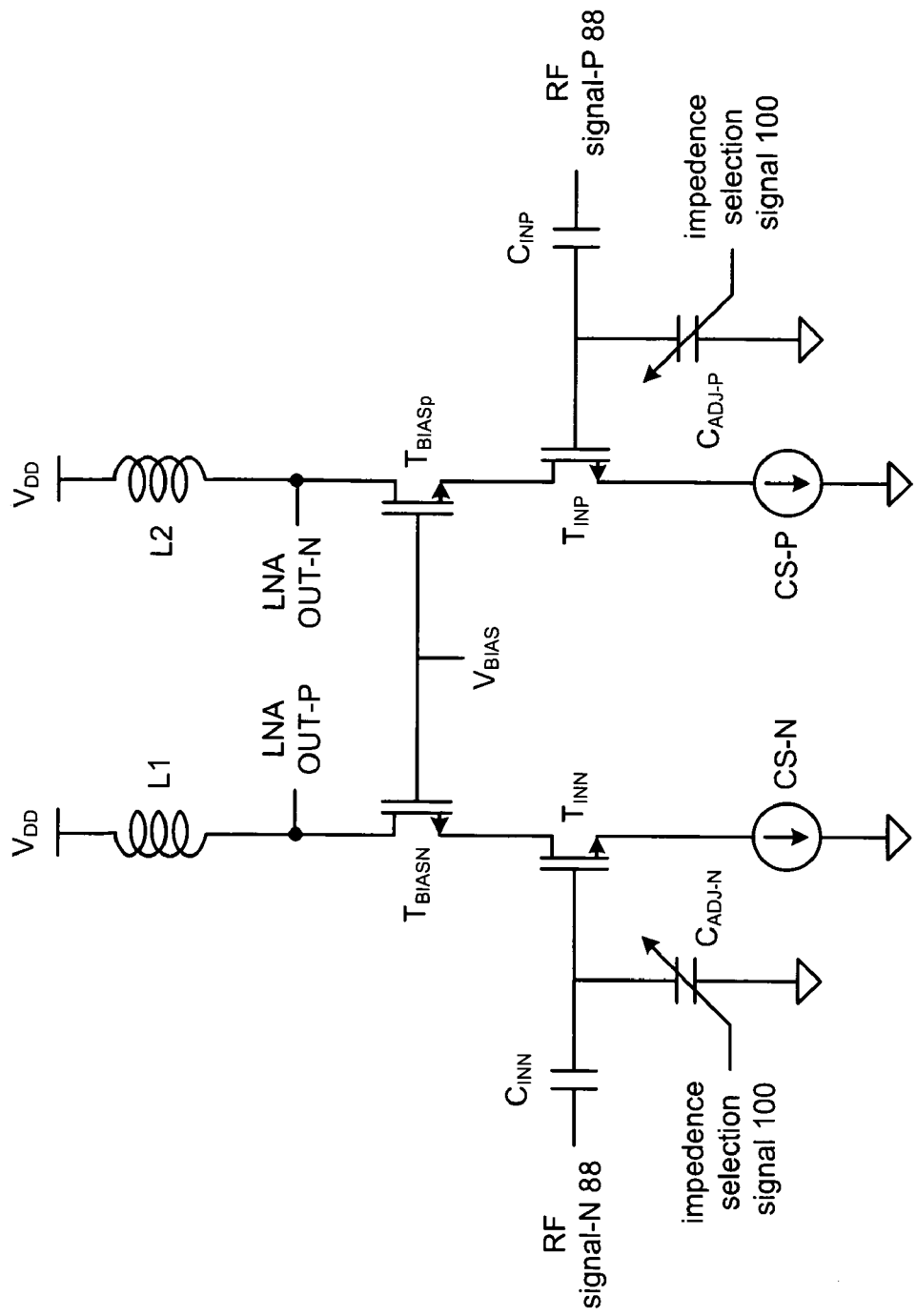
FIG. 6 is a schematic block diagram of yet another embodiment of a low noise amplifier in accordance with the present invention.

FIG. 6 is a schematic block diagram of another embodiment of a low noise amplifier 72 that operates on a differential RF signal 88. In this embodiment, the low noise amplifier includes two output inductors $L_1$ and $L_2$, two bias transistors $T_{BIASN}$ and $T_{BIASP}$, to input transistors $T_{INN}$ and $T_{INP}$, two input capacitors $C_{INN}$ and $C_{INP}$, two adjustable capacitors $C_{ADJN}$ and $C_{ADJP}$, and two current sources CSN and CSP. The adjustable capacitors $C_{ADJN}$ and $C_{ADJP}$ are adjusted based on the impedance selection signal 100 to ensure that the imaginary component of the input impedance of the low noise amplifier remains substantially constant regardless of whether the low noise amplifier is on or off.

Figure 7:
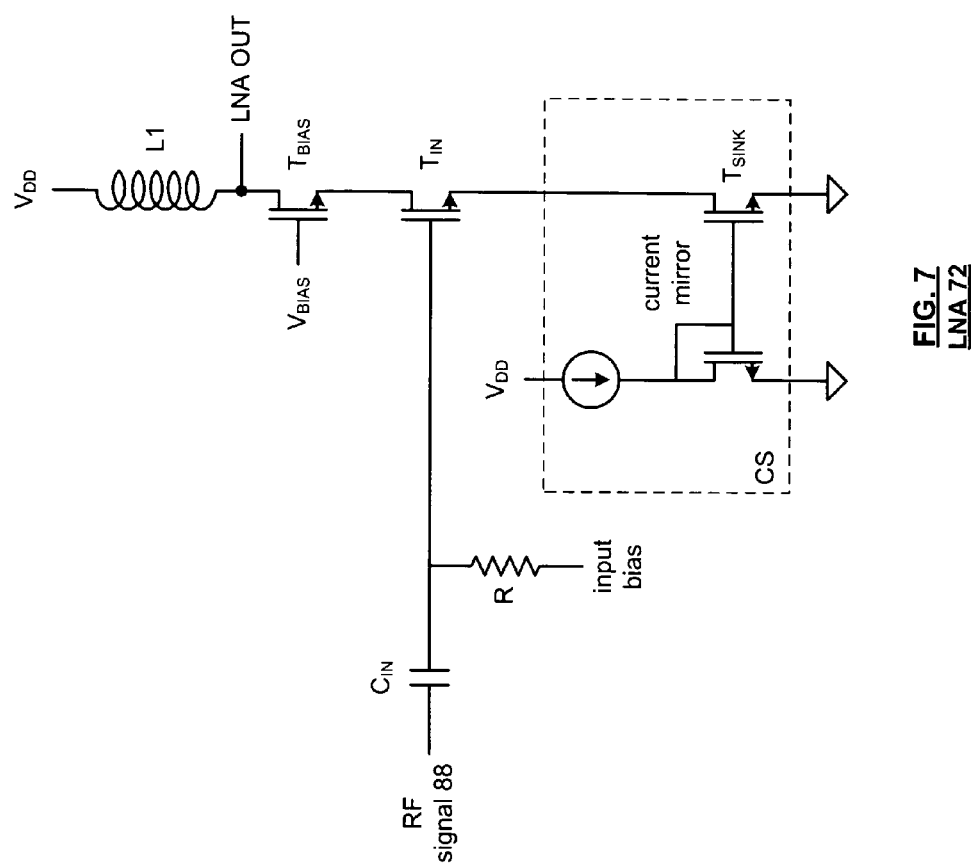
FIG. 7 is a schematic block diagram of a further embodiment of a low noise amplifier in accordance with the present invention.

FIG. 7 illustrates another embodiment of a low noise amplifier 72. In this embodiment, the low noise amplifier includes the output inductor $L_1$, the bias, or cascode, transistor $T_{BIAS}$, the input transistor $T_{IN}$, the current source, an input bias resistor R, and the input capacitor $C_{IN}$. The current source includes a sink transistor $T_{SINK}$ and a current mirror. In this embodiment, the input impedance of the low noise amplifier 72 is more clearly represented in that the current source includes the sink transistor. The parasitic components of the sink transistor contribute to the input impedance. The adjustable capacitor, (not shown) may be added to compensate the imaginary component of the input impedance such that it remains substantially constant in the on and off modes of the low noise amplifier.

Note that the size (width and length) of the bias transistor and the input transistor may be of the same. Further, the input transistor may use a small length to improve the speed of operation. For instance, the input transistor may have a width length of 96 microns/0.13 microns.

Figure 8:
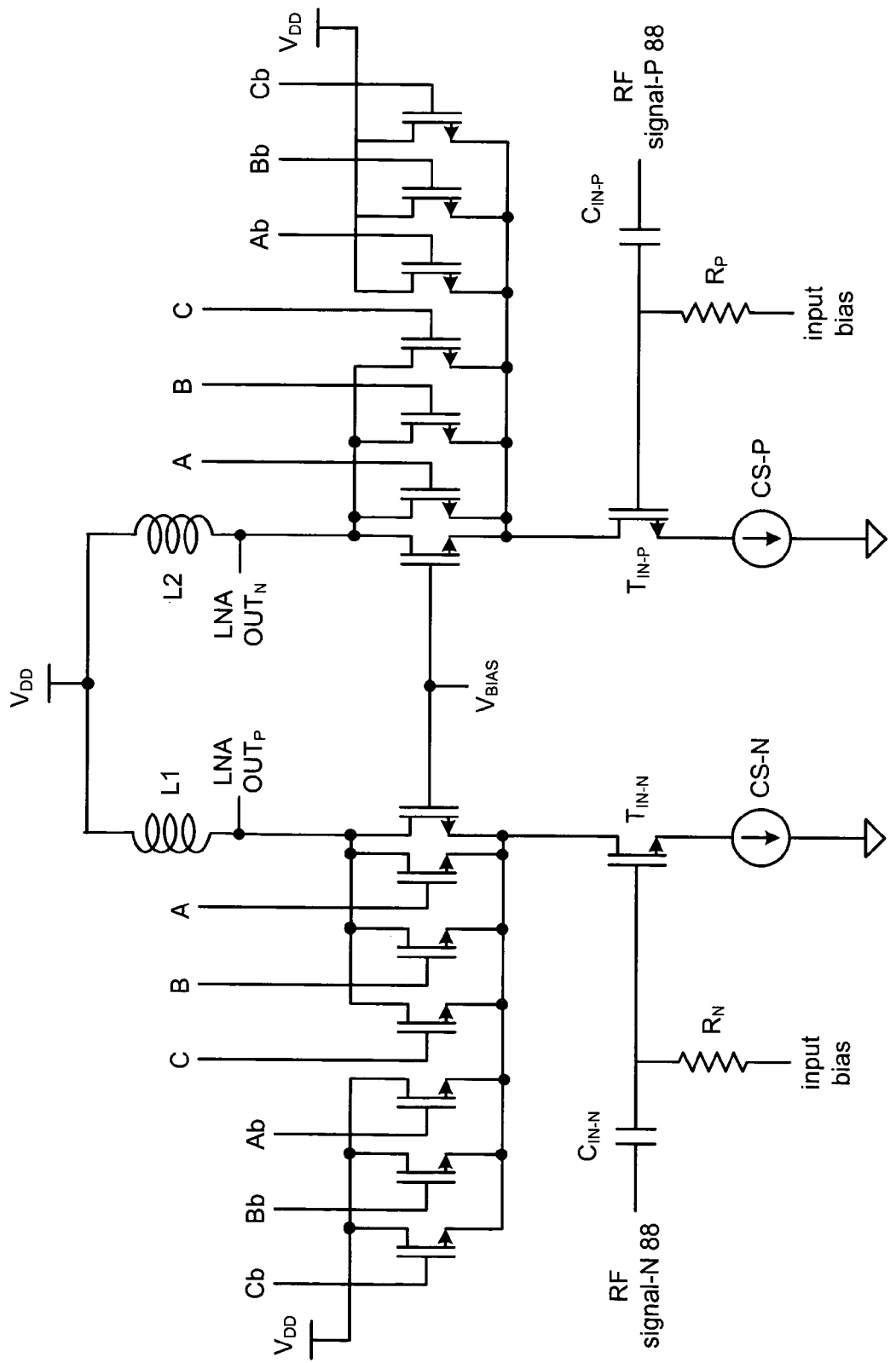
FIG. 8 is a schematic block diagram of a still further embodiment of a low noise amplifier in accordance with the present invention.

FIG. 8 illustrates yet another embodiment of the low noise amplifier 72. In this embodiment, the low noise amplifier is a differential low noise amplifier and includes inductors $L_1$ and $L_2$ (e.g., 7.38 nH, Q=6.55), input transistors $T_{INN}$ and $T_{INP}$ (e.g., W/L=96μ/0.13μ), input capacitors $C_{INN}$ and $C_{INP}$, input bias resistors $R_N$ and $R_P$ and current sources CS-N and CS-P. Note that a single current source may be used in place of CS-N and CS-P operably coupled to ground and the sources of the input transistors. The bias, or cascode, transistors include a plurality of parallel transistors each coupled to a different control signal. In this embodiment, three transistors are coupled in parallel to the bias transistor and are controlled by control signals A, B, C. Further, three additional transistors are coupled to the source of the primary bias transistor and are gated by the inverse signals of A, B and C. The drains of each of these additional transistors are coupled to the power supply ($V_{DD}$).

In this embodiment, the cascode transistor configuration allows for different level shifting of the low noise amplifier, and/or different power levels of the low noise amplifier.

As with the previous embodiments of the low noise amplifier, this embodiment provides a substantially constant real component of the input impedance of the low noise amplifier regardless of whether the low noise amplifier is in the on-state or off-state. With the addition of the adjust capacitors (not shown), the imaginary component of the input impedance of the low noise amplifier may also be adjusted to remain constant regardless of whether the low noise amplifier is in the on-state or off-state.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a constant input impedance low noise amplifier that may be used in a wireless communication device. As one of average skill in the art will appreciate, other embodiments may be derived from the teaching of the present invention without deviating from the scope of the claims.

What is claimed is:

1. A low noise amplifier having a substantially constant input impedance in an on mode as in an off mode, the low noise amplifier comprises:
    input transistor having a gate, a drain, and a source, wherein the gate of the input transistor is operably coupled to receive an input radio frequency (RF) signal;
    an inductor having a first node and a second node, wherein the first node of the inductor is operably coupled to a power supply and the second node of the inductor is operably coupled to the drain of the input transistor to provide an output of the low noise amplifier; and
    current sink having a first node and a second node, wherein the first node of the current sink is operably coupled to the source of the input transistor and the second node of the current sink is operably coupled to a circuit ground, wherein a real component of input impedance of the low noise amplifier is substantially constant when the low noise amplifier is in the off mode as when the low noise amplifier is in the on mode.

2. The low noise amplifier of claim 1 further comprises:
    a variable capacitor circuit operably coupled to the gate of the input transistor, wherein the variable capacitor circuit provides a first capacitance value based on a first impedance selection signal when the low noise amplifier is in the off mode and provides a second capacitance value based on a second impedance selection signal when the low noise amplifier is in the on mode such that an imaginary component of the input impedance of the low noise amplifier is substantially constant when the low noise amplifier is in the off mode as when the low noise amplifier is in the on mode.

3. The low noise amplifier of claim 1, wherein the operable coupling between the second node of the inductor and the drain of the input transistor comprises:
   a cascode transistor having a gate, a drain, and a source, wherein the source of the cascode transistor is operably coupled to the drain of the input transistor, the drain of the cascode transistor is operably coupled to the second node of the inductor, and the gate of the cascode transistor is operably coupled to receive a bias voltage.

4. The low noise amplifier of claim 1 further comprises:
   a second input transistor having a gate, a drain, and a source, wherein the gate of the second input transistor is operably coupled to receive one leg of the input RF signal and the gate of the input transistor is operably coupled to receive another leg of the input RF signal, and wherein the source of the second input transistor is operably coupled to the first node of the current sink; and
   a second inductor having a first node and a second node, wherein the first node of the second inductor is operably coupled to the power supply and the second node of the inductor is operably coupled to the drain of the second input transistor to provide one leg of the output of the low noise amplifier.

5. The low noise amplifier of claim 4 further comprises:
   each of the input transistor and the second input transistor having a width of W and a length of L, wherein parasitic capacitance of the input transistor and of the second input transistor is based on W; and
   the current sink including a current mirror circuit and a current sink transistor operably coupled to the current mirror circuit, wherein the current sink transistor has a width of approximately 2 W and a length of approximately 2 L.

6. The low noise amplifier of claim 1 further comprises:
input capacitor operably coupled to provide the input RF signal to the gate of the input transistor.

7. The low noise amplifier of claim 1, wherein the operable coupling between the second node of the inductor and the drain of the input transistor comprises:
   a cascode transistor having a gate, a drain, and a source, wherein the source of the cascode transistor is operably coupled to the drain of the input transistor, the drain of the cascode transistor is operably coupled to the second node of the inductor, and the gate of the cascode transistor is operably coupled to receive a bias voltage;
   a first plurality of transistors, wherein each of the first plurality of transistors includes a gate, a drain, and a source, wherein the sources of each of the first plurality of transistors is operably coupled to the source of the cascode transistor and the drain of each of the first plurality of transistors is operably coupled to the drain of the cascode transistor, and wherein the gate of each of the first plurality of transistors is operably coupled to a corresponding one of a plurality of control signals; and
   a second plurality of transistors, wherein each of the second plurality of transistors includes a gate, a drain, and a source, wherein the sources of each of the second plurality of transistors is operably coupled to the source of the cascode transistor and the drain of each of the second plurality of transistors is operably coupled to the power supply, and wherein the gate of each of the second plurality of transistors is operably coupled to a corresponding complementary one of the plurality of control signals.

8. A radio frequency integrated circuit (RFIC) comprises:
   a transformer having a first winding and a second winding, wherein the first winding is operably coupled to an antenna for transceiving radio frequency (RF) signals;
   baseband processing module operably coupled to convert outbound data into outbound baseband signals and to convert inbound baseband signals into inbound data based on a wireless communication protocol;
   up conversion module operably coupled to convert the outbound signals into outbound RF signals;
   a power amplifier operably coupled to the second winding of the transformer to transmit the outbound RF signals via the antenna;
   a low noise amplifier operably coupled to the second winding of the transformer to receive inbound RF signals from the antenna; and
   down conversion module operably coupled to covert the receive inbound RF signals into the inbound baseband signals, wherein the low noise amplifier includes:
      input transistor having a gate, a drain, and a source, wherein the gate of the input transistor is operably coupled to receive an input radio frequency (RF) signal;
      an inductor having a first node and a second node, wherein the first node of the inductor is operably coupled to a power supply and the second node of the inductor is operably coupled to the drain of the input transistor to provide an output of the low noise amplifier; and
      current sink having a first node and a second node, wherein the first node of the current sink is operably coupled to the source of the input transistor and the second node of the current sink is operably coupled to a circuit ground, wherein a real component of input impedance of the low noise amplifier is substantially constant when the low noise amplifier is in the off mode as when the low noise amplifier is in the on mode.

9. The RFIC of claim 8, wherein the low noise amplifier further comprises:
   a variable capacitor circuit operably coupled to the gate of the input transistor, wherein the variable capacitor circuit provides a first capacitance value based on a first impedance selection signal when the low noise amplifier is in the off mode and provides a second capacitance value based on a second impedance selection signal when the low noise amplifier is in the on mode such that an imaginary component of the input impedance of the low noise amplifier is substantially constant when the low noise amplifier is in the off mode as when the low noise amplifier is in the on mode.

10. The RFIC of claim 8, wherein the operable coupling between the second node of the inductor and the drain of the input transistor comprises:
    a cascode transistor having a gate, a drain, and a source, wherein the source of the cascode transistor is operably coupled to the drain of the input transistor, the drain of the cascode transistor is operably coupled to the second node of the inductor, and the gate of the cascode transistor is operably coupled to receive a bias voltage.

11. The RFIC of claim 8, wherein the low noise amplifier further comprises:
    a second input transistor having a gate, a drain, and a source, wherein the gate of the second input transistor is operably coupled to receive one leg of the input RF signal and the gate of the input transistor is operably coupled to receive another leg of the input RF signal, and wherein the source of the second input transistor is operably coupled to the first node of the current sink; and a second inductor having a first node and a second node, wherein the first node of the second inductor is operably coupled to the power supply and the second node of the inductor is operably coupled to the drain of the second input transistor to provide one leg of the output of the low noise amplifier.

12. The RFIC of claim 11, wherein the low noise amplifier further comprises:

each of the input transistor and the second input transistor having a width of W and a length of L, wherein parasitic capacitance of the input transistor and of the second input transistor is based on W; and the current sink including a current mirror circuit and a current sink transistor operably coupled to the current mirror circuit, wherein the current sink transistor has a width of approximately 2 W and a length of approximately 2 L.

13. The RFIC of claim 8, wherein the low noise amplifier further comprises:

input capacitor operably coupled to provide the input RF signal to the gate of the input transistor.

14. The RFIC of claim 8, wherein the operable coupling between the second node of the inductor and the drain of the input transistor comprises:

a cascode transistor having a gate, a drain, and a source, wherein the source of the cascode transistor is operably coupled to the drain of the input transistor, the drain of the cascode transistor is operably coupled to the second node of the inductor, and the gate of the cascode transistor is operably coupled to receive a bias voltage;

a first plurality of transistors, wherein each of the first plurality of transistors includes a gate, a drain, and a source, wherein the sources of each of the first plurality of transistors is operably coupled to the source of the cascode transistor and the drain of each of the first plurality of transistors is operably coupled to the drain of the cascode transistor, and wherein the gate of each of the first plurality of transistors is operably coupled to a corresponding one of a plurality of control signals; and a second plurality of transistors, wherein each of the second plurality of transistors includes a gate, a drain, and a source, wherein the sources of each of the second plurality of transistors is operably coupled to the source of the cascode transistor and the drain of each of the second plurality of transistors is operably coupled to the power supply, and wherein the gate of each of the second plurality of transistors is operably coupled to a corresponding complementary one of the plurality of control signals.

* * * * *